SEMICONDUCTOR CIRCUIT MEANS HAVING DUAL BIASING LEVELS

Filed Sept. 28, 1959

INVENTOR.
BALTHASAR H. PINCKAERS
BY Omund R. Dahle
ATTORNEY

SEMICONDUCTOR CIRCUIT MEANS HAVING DUAL BIASING LEVELS

Filed Sept. 28, 1959 2 Sheets-Sheet 2

Fig-3

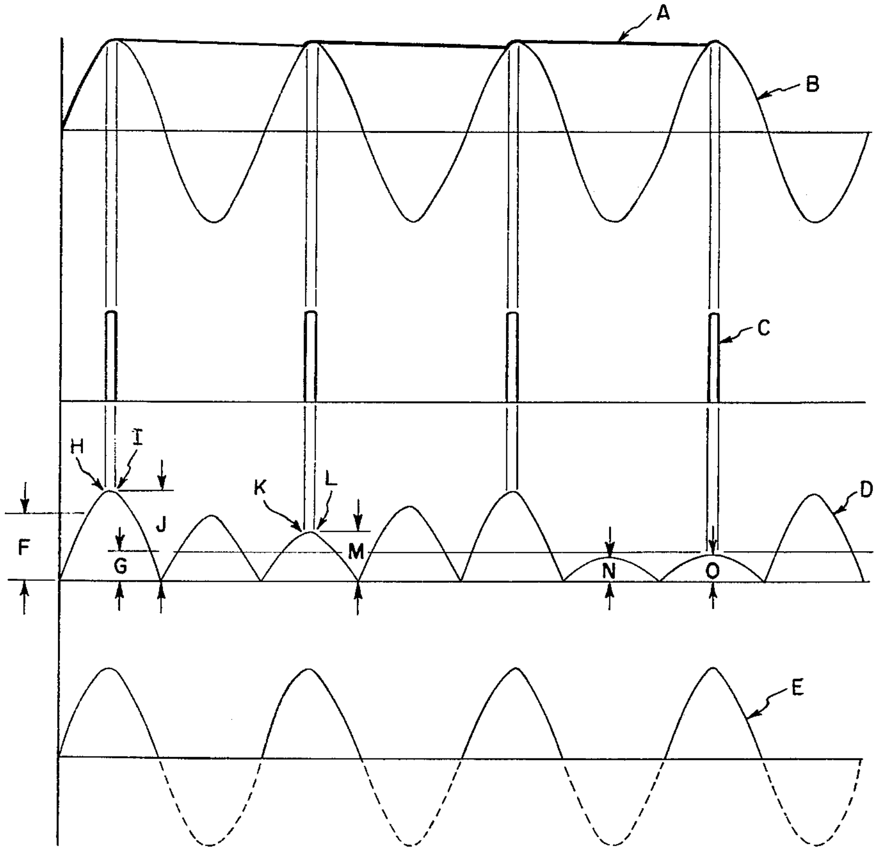

WAVEFORM A: VOLTAGE WAVEFORM ON CAPACITOR 43

WAVEFORM B: VOLTAGE WAVEFORM ACROSS TRANSFORMER SECONDARIES 46 AND 89

WAVEFORM C: RESET PULSES

WAVEFORM D: FULL-WAVE RECTIFIED INPUT SIGNAL (FIG. 1)

WAVEFORM E: DISCRIMINATED INPUT SIGNAL (FIG. 2)

*INVENTOR.*
BALTHASAR H. PINCKAERS
*BY*
Omund R. Dahle
*ATTORNEY*

2,999,175

SEMICONDUCTOR CIRCUIT MEANS HAVING DUAL BIASING LEVELS

Balthasar H. Pinckaers, Edina, Minn., assignor to Minneapolis-Honeywell Regulator Company, Minneapolis, Minn., a corporation of Delaware Filed Sept. 28, 1959, Ser. No. 842,778
10 Claims. (Cl. 307—88.5)

This invention relates to electronic control systems and more specifically to a novel transistor switching circuit for use with condition sensing apparatus.

It is an object of this invention to provide an electronic switching circuit which may be activated by unfiltered rectified alternating current, either full wave or half wave, or by direct current.

Another object of this invention is to provide an electronic switching circuit which has a very fast response and a narrow differential.

A further object of this invention is to provide an electronic switching circuit which is self-checking.

These and other objects of my invention will become apparent to those skilled in the art upon consideration of the accompanying specification, claims, and drawings of which:

FIGURE 3 is a table showing voltages and currents present in various parts of the circuits shown in FIGURES 1 and 2.

*FIGURE 1*

Figure 1:
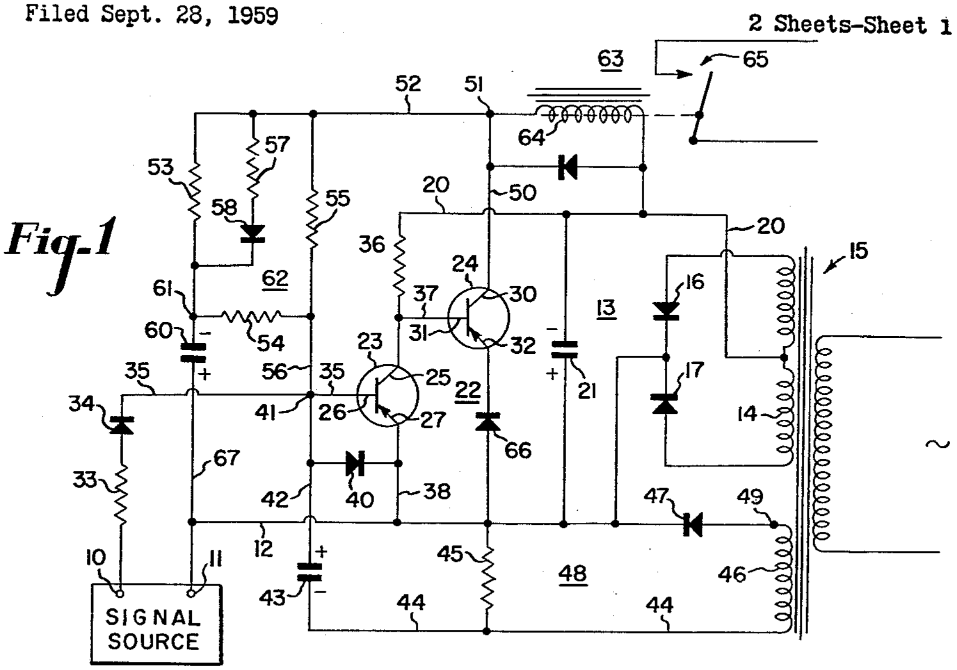
FIGURE 1 is a schematic diagram of an embodiment of this invention.

Referring to FIGURE 1 there is shown an input signal source with a pair of terminals 10 and 11. Terminal 11 is connected by means of a conductor 12 to the positive side of a source of potential 13. The D.C. potential source 13 shown as a conventional filtered full wave rectifier, comprises a center tapped secondary winding 14 of a transformer 15, the terminals of which are connected together through oppositely connected rectifiers 16 and 17 and said center tap is connected through a conductor 20 to one side of a capacitor 21, the other side of capacitor 21 being connected to the junction between rectifiers 16 and 17.

A bistable switch 22 includes a pair of current controlling means shown as transistors 23 and 24. Transistor 23 has a collector 25, a base 26, and an emitter 27. Transistor 24 has a collector 30, a base 31, and an emitter 32.

Terminal 10, of the input signal source, is connected through a resistor 33, a diode 34, and a conductor 35 to the base 26 of transistor 23. Collector 25 of transistor 23 is connected through a resistor 36 to the negative conductor 20. Collector 25 is further connected through a conductor 37 to the base 31 of transistor 24. Emitter 27 of transistor 23 is connected through a conductor 38 to the positive conductor 12. The base 26 of transistor 23 is connected through a diode 40 to the emitter 27. The polarity of the diode 40 is opposite to the low impedance path of transistor 23. Base 26 is further connected through conductor 35, a junction 41, a conductor 42, a capacitor 43, a conductor 44, and a resistor 45, in parallel with the series combination of a secondary 46 and a rectifier 47 to the positive conductor 12. Diode 40, capacitor 43, resistor 45, secondary winding 46, and rectifier 47 form a first biasing circuit 48 for transistor 23.

Collector 30 of transistor 24 is connected through a conductor 50, a junction 51, a conductor 52, resistors 53 and 54 in parallel with a resistor 55, and a conductor 56 to the base 26 of transistor 23. A resistor 57 and a diode 58 are connected in series across resistor 53. A capacitor 60 is connected from a junction 61, between resistors 53 and 54, to positive conductor 12. Resistors 53, 54, 55 and 57, diode 58, and capacitor 60, form a second biasing circuit 62 for transistor 23.

Collector 30 of transistor 24 is further connected through conductor 50 and a winding 64 of a relay 63 to the negative conductor 12.

Emitter 32 of transistor 24 is connected through a diode 66 to the positive conductor 12.

*Operation of FIGURE 1*

The control apparatus of FIGURE 1 comprises in a broad sense, an input signal source, a bistable switch with a periodic reset, and a load controlled by the switch.

The input signal source, shown for simplicity of explanation in a block diagram form, may be in the form of a conventional balanced bridge circuit, one leg of which contains a sensing device that unbalances the bridge under given conditions and produces an output signal, the magnitude of which is proportional to the change in the condition being sensed.

The output of the input signal source, is used to activate the bistable switch 22 from a first to a second stable state. Bistable switch 22 includes transistors 23 and 24. The first biasing circuit 48 is connected to transistor 23 to provide an activation bias level and a periodic reset bias pulse for the bistable switch. The periodic reset bias pulse switches the bistable switch from its second to first stable state.

The second biasing circuit 62, connected to transistor 23, provides a dual level bias dependent upon the state of said bistable switch including an activation bias level and further provides a change in this bias level, upon the initial activation of the bistable switch to insure that an input signal of lesser magnitude will reactivate the switch after it has been reset by the first biasing circuit.

The load winding 64 of relay 63, is connected to the output of transistor 24. Activation of relay 63, by the conduction of transistor 24 through relay winding 64, closes relay contact 65 and energizes further circuitry. This further circuitry may be, for example, a counting device, a compensating device that corrects the condition that originally unbalanced the input circuit or the like.

In considering the specific operation of the circuit of FIGURE 1, assume that power has been applied to the circuit through transformer 15 and that there is no input signal.

A charging path for capacitor 60, of the second biasing circuit, can be traced from the positive side of the potential source, through conductor 12, conductor 67, capacitor 60, resistors 54 and 55 in parallel with resistor 53, conductor 52, and winding 64 of relay 63, to the negative side of the source. This current flow will charge capacitor 60 to the polarity indicated.

Another current path through the second biasing circuit, is from the positive source, through conductor 12, conductor 38, emitter 27 to base 26 of transistor 23, con- conductor 56, resistors 53, 54, and 55 of the second biasing circuit 62, conductor 52, and winding 64 of relay 63, to the negative source. These combined currents flowing through winding 64 are insufficient to activate the relay, however, they do bias the winding somewhat and improve the relay activation response. Since the base current flow, through the second biasing circuit, biases transistor 23 in the conductive state, there will be a further current path from emitter to collector, through resistor 36 and conductor 20, to the negative source. Since the collector of transistor 23 is tied directly through conductor 37 to the base of transistor 24, the collector current flowing in transistor 23 will bias transistor 24 to a non-conducting state. Transistor 23 conducting and transistor 24 non-conducting are the operating conditions for the first or "off" state of bistable switch 22.

The first biasing circuit 48 is connected to the input of transistor 23 to provide a dual bias of opposite polarities to this transistor. This is accomplished substantially as follows: secondary 46, of transformer 15, and rectifier 47 form a half-wave unfiltered rectifier. On alternate half cycles, when terminal 49 of secondary 46 goes positive, a reset current pulse will flow in a path which may be traced from terminal 49, through rectifier 47, conductor 12, conductor 38, emitter 27 to base 26 of transistor 23, conductor 42, capacitor 43, and conductor 44 to the other side of secondary 46. This current flow is in a direction to bias transistor 23 in its forward or conducting state and also charges capacitor 43 to the polarity shown. This reset current path is a relatively low impedance path and the magnitude of the current pulse is therefore relatively large. On the other half cycles, when terminal 49 is negative no current flows in winding 46 because of rectifier 47, and capacitor 43 begins to discharge. The discharge path for this capacitor is from the positive plate, through conductor 42, the base to emitter circuit of transistor 23, conductor 38, resistor 45, and conductor 44 to the other side of the capacitor. Because of the relative large values of capacitor 43 and resistor 45, the discharge time for this capacitor is very long so that only a very small portion of the capacitor charge leaks off before the next positive half cycle of secondary 46. The fact that capacitor 43 retains most of its charge means that current will flow in the charging path of this capacitor only during the peaks of the portion of the half cycle when terminal 49, of secondary 46, is positive. Therefore the first biasing circuit 48 will bias transistor 23 in the forward direction for only a very small portion of each cycle. During the remainder of each cycle the discharge current of capacitor 43 flowing in transistor 23 and which is in opposition to the main bias current flowing in the second bias circuit, above described, tends to bias transistor 23 in a reverse, or non-conducting direction.

The reverse bias current produced by the first biasing circuit is, in itself, not sufficient to overcome the forward bias produced by the second biasing circuit, so that the bistable switch remains in its first stable state.

The voltage on capacitor 43 is shown as curve A in FIGURE 3. Because of the large discharge time of capacitor 43, this reverse bias current on transistor 23 remains substantially constant. It can be seen from the above discussion that the first biasing circuit performs a dual function, that is, for the majority of each cycle it applies a reverse bias current to transistor 23 and periodically it applies a short forward bias or reset pulse to the transistor. Curve C of FIGURE 3 shows the reset current pulse wave form.

Since the bistable switch is already in its first stable state this reset pulse has no effect on the circuit, however, if the switch had been in its second stable state the reset pulse would have returned, or "reset," it to its first stable state. This resetting of the switch provides a means for periodically checking the magnitude of the input signal.

In one successful embodiment of this invention, the transformer 15 and the sensing bridge in the input signal source were energized from the same supply, so that the voltage on secondary 46 and the full wave rectified output of the bridge would be in phase. This was done so that the reset pulse would always appear when the input signal was at its peak value. Curves B and D of FIGURE 3 show the voltage across secondary 46 and the output of the sensing bridge respectively.

Assume now that the input signal source senses a condition change and applies a signal to the bistable switch. As the magnitude of the input signal increases, current will flow from terminal 10, through resistor 33, diode 34, conductor 35, base 26 to emitter 27 of transistor 23, conductor 38, and conductor 12, to terminal 11 of the input signal source. This current flow opposes the forward bias current of transistor 23 and decreases the conduction of this transistor if of sufficient magnitude.

As the conduction of transistor 23 decreases, the forward bias on transistor 24 is increased and the current will flow from the positive side of the potential source, through conductor 12, diode 66, emitter 32 to base 31 of transistor 24, conductor 37, and resistor 36, to the negative conductor 20. Since this base current flow biases transistor 24 to its conductive, or "on," state, current will also flow from the positive source, through the emitter to collector, conductor 50, and winding 64 of relay 63, to the negative conductor 20.

As transistor 24 commences conducting, the potential at junction 51 approaches the potential on the positive conductor 12. This change in potential at junction 51 is regeneratively coupled back, through the second biasing circuit, to the base 26 of transistor 23, further decreasing the conduction of this transistor. This decrease in conduction of transistor 23 further increases the conduction of transistor 24 and so on, until transistor 24 is fully conducting and transistor 23 is substantially cut off. The conduction of transistor 24, through winding 64, activates relay 63. The conditions where transistor 24 is conducting and transistor 23 is cut off form the second, or "on" state of bistable switch 22. This switching from the "off" to the "on" states is snap acting and occurs very rapidly.

The change in potential at junction 51 is also coupled, through the second biasing circuit, to capacitor 60, discharging this capacitor. The discharge path for capacitor 60 is from the positive plate, through conductor 67, conductor 12, diode 66, emitter 32 to collector 30 of transistor 24, conductor 50, conductor 52, and the second biasing circuit 62, to the other side of the capacitor. Since the resistance of resistor 57 is relatively small the discharge time of capacitor 60 will be short.

The bistable switch 22 will remain in its second stable state until the appearance of the reset pulse from the first biasing circuit, above discussed, whereupon it will return to its first stable state; the reset pulse being of sufficient magnitude to override the action of the input signal and the first biasing circuit, both of which tend to hold the switch in its second stable state. However, if the input signal is still of sufficient magnitude, the switch will immediately return to its second stable state after the disappearance of the reset pulse, where it will remain until the next reset pulse. This cyclic action continues as long as an input signal of sufficient magnitude is applied to the circuit. Relay 63 remains energized during this cyclic action, due to the fact that the dropout time of the relay is long enough so that the switch will have returned to its second stable state before the relay has had time to de-energize.

The magnitude of the input signal required after reset, however, is less than the magnitude required to initially activate the circuit. This is due to the fact that after the input signal initially activates the bistable switch to its second stable state, capacitor 60 discharges, as explained above, and junction 61 approaches the potential of the positive conductor 12. When the reset pulse returns the switch to its first stable state, the potential of junction 61 cannot immediately change because of the relatively long charge time of capacitor 60, so that the forward bias path of transistor 23 is now mostly through resistor 55 and not through resistors 53 and 54. This means that the forward bias current is less than it was before the switch was initially activated. Since the forward bias has decreased, the magnitude of the input signal required to activate the switch has also decreased.

This operation can be understood more fully by referring to FIGURE 3. The wave forms in FIGURE 3 are exaggerated for the purpose of illustration. Curve D shows the output of the condition sensing bridge of the input signal source. The magnitude of this signal is proportional to the change in the condition sensed. Magnitude F is the magnitude of signal initially required to activate bistable switch 22. When the input signal reaches this magnitude the switch will be activated to its "on" condition. After the switch has initially been activated the magnitude of signal required for subsequent reactivation drops to magnitude G. The difference between magnitude F and magnitude G constitutes an activation signal differential. At point H, the reset pulse from the first biasing circuit appears and returns the switch to its off condition. At point I the reset pulse disappears, and since the magnitude of the signal at this point, magnitude J, is greater than magnitude G, the switch will return to its "on" condition. The switch 22 will remain in its "on" condition until point K, when the next reset pulse appears and again returns to its "off" condition. When this reset pulse disappears, at point L, the magnitude of the input signal, magnitude M, is still greater than magnitude G, so the switch is again reactivated. This cyclic action will continue as long as the signal magnitude is sufficient to reactivate the switch after reset.

It can be seen that at magnitude N the input signal is less than the required reactivation magnitude, but since the switch is already in its "on" condition this has no effect on the circuit operation. However, if this magnitude change remains less than the magnitude G during the time that the reset pulse appears, as shown at point O, the switch will be returned to its "off" condition and will remain there until the appearance of another input signal with a magnitude greater than the initial activating magnitude F.

Upon the disappearance of the input signal the next reset pulse will return the bistable switch to its first stable state, where it will remain until another input signal is applied.

It can be seen from the above discussion that this switching system is self-checking since it periodically resets itself to check the magnitude of the input signal. It can also be seen that this system allows for an input signal differential by the action of the second biasing circuit, and that this differential is substantially independent of the transistors.

*FIGURE 2*

Figure 2:
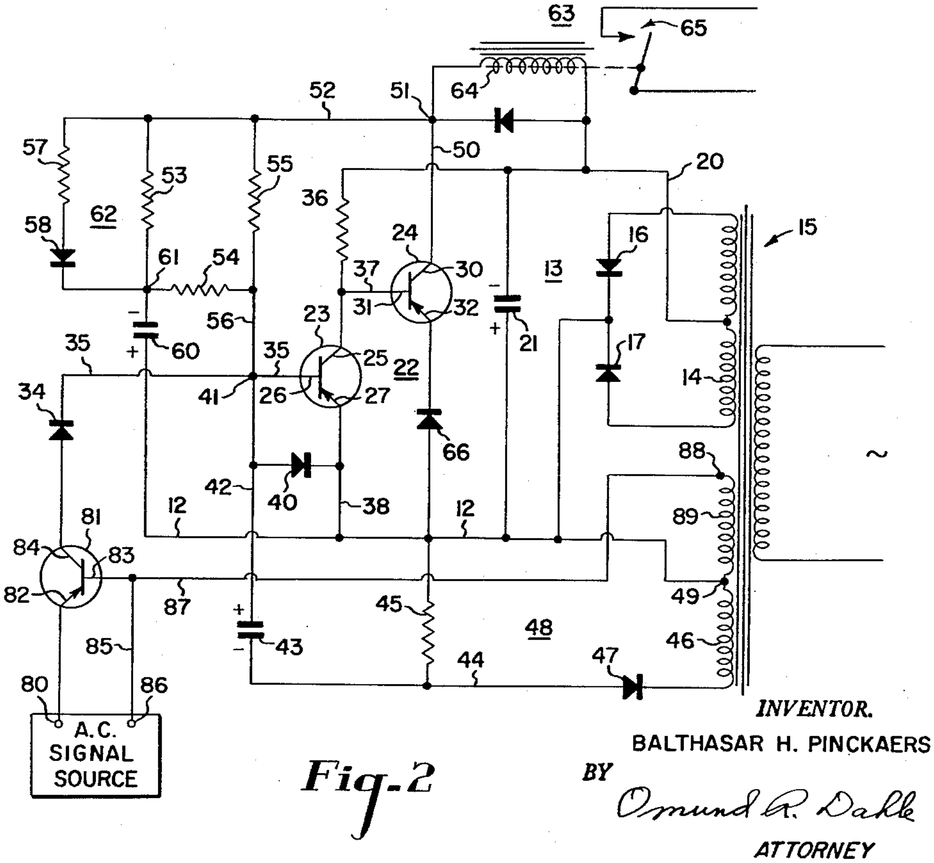
FIGURE 2 is a modification of FIGURE 1.

In FIGURE 2, which is a modification of FIGURE 1, the same numerals have been used for component identification except at the points of modification. Since the components, connections, and operation of FIGURE 2 are similar to FIGURE 1 only the modifications will be discussed.

In FIGURE 2 a terminal 80, of an A.C. input signal source, is connected to an emitter 82 of a transistor 81. A base 83 of transistor 81 is connected through a conductor 85 to a terminal 86 of the A.C. input signal source. The base 83 is further connected through a conductor 87 and a junction 88 to one side of a secondary 89 of transformer 15. The other side of secondary 89 is connected to the positive conductor 12. A collector 84, of transistor 81, is connected through diode 34 and conductor 35 to the base 26 of transistor 23.

In operation, transistor 81 and secondary 89 of transformer 15, form a phase discriminating circuit. When terminal 80 of the A.C. input signal source goes positive, with respect to terminal 86, current will flow from terminal 80, through the emitter to base of transistor 81 and conductor 85 to terminal 86. This emitter current flow will bias transistor 81 to its conducting state. If, at the same time, terminal 88 of secondary 89 goes positive, current will also flow from terminal 88, through conductor 87, base 83 to collector 84 of transistor 81, diode 34, conductor 35, base 26 to emitter 27 of transistor 23, and conductors 38 and 12 to the other side of secondary 89. This current flow will activate bistable switch 22 when the input signal is sufficiently large. No current will flow in this circuit when terminal 88, of secondary 89 is negative, because of the high impedance offered by diode 34 in the reverse direction. Also, if the phase of the input signal is reversed so that terminal 80, of the A.C. input signal source, is negative with respect to terminal 86 when terminal 88 is positive, transistor 81 will be biased to its nonconducting, or "off" state, and therefore no current can flow in the collector circuit of transistor 81 to activate the bistable switch. The phase relationship, between the discriminator output and voltage wave form across transformer secondary 89, can be seen from FIGURE 3.

It can be seen from this discussion that the bistable switch 22 will be activated only upon the sensing of a condition providing the proper phase of signal current such that terminal 80 of the input signal source is positive at the same time as terminal 88 of transformer secondary 89.

The secondaries 46 and 89, of transformer 15, are connected so that terminals 49 and 88 go positive at the same time, as shown in wave form B of FIGURE 3. This is done so that the activating signal is applied to the bistable switch during the same half cycle that the periodic reset pulse is applied.

It is to be understood that while I have shown certain special embodiments of my invention, this is for the purpose of illustration only, and that my invention is to be limited solely by the scope of the appended claims.

I claim as my invention:

1. Switching apparatus comprising: switching means having input and output terminals and being operable between a first and a second stable state; load means connected to the output terminals of said switching means, said load means being de-energized when said switching means is in its first stable state and energized when in its second stable state; a source of input signals connected to the input terminals of said switching means to activate said switching means from said first stable state to said second stable state; first biasing means connected to the input terminals of said switching means for providing a substantially constant bias and a further periodic bias, said substantially constant bias being of such polarity as to tend to switch said switching means to said second stable state, said further periodic bias being of such polarity as to switch said switching means to said first stable state; and variable second biasing means, said variable second biasing means being connected from the output terminals to input terminals of said switching means and being operable in response to the output of said switching means, said variable second biasing means controlling said switching means so as to insure activation of said switching means when the input signal varies from an initial predetermined activating magnitude to a subsequent lesser predetermined activating magnitude.

2. Switching apparatus comprising: bistable switching means having input and output terminals and being operable between a first and a second stable state; load means connected to the output terminals of said switching means, said load means being de-energized when said switching means is in its first stable state and energized in its second stable state; a source of input signals connected to the input terminals of said switching means to activate said switching means from said first stable state to said second stable state; bias generating means energized independent of signal source and connected to said input terminals of said switching means to provide a substantially constant bias and a further periodic bias, said substantially constant bias being of such polarity as to tend to switch said switching means to said second stable state and to thereafter maintain said switching means in said second stable state until the appearance of said further periodic bias, said further periodic bias being of such polarity and of sufficient magnitude to override said source of signal so as to switch said switching means to said first stable state.

3. Switching apparatus comprising: switching means comprising first and second current control means each having input and output terminals and being operable between a first and a second stable state, circuit means connecting said output terminals of said first current control means to said input terminals of said second current control means; load means connected to said output terminals of said second current control means, said load means being de-energized when said switching means is in its first stable state and energized when in said second stable state; a source of input signal connected to said input terminals of said first current control means and operable upon a predetermined magnitude to switch said switching means from said first stable state to said second stable state; first biasing means connected to said input terminals of said first current control means to periodically switch said switching means from said second stable state to said first stable state; and variable second biasing means connected from said output terminals of said second current control means to said input terminals of said first current control means to vary the level of said input signal magnitude required to activate said switching means, said level of input signal magnitude being variable by varying the effective impedance of said second biasing means in response to the output of said second current control means, said variance in said input signal level constituting an input signal differential determined by said second biasing means and being substantially independent of said first and second current control means.

4. Switching apparatus comprising: bistable switching means comprising first and second current control means each having input and output terminals and being operable between a first and a second stable state, circuit means connecting said output terminals of said first current control means to said input terminals of said second current control means; load means connected to said output terminals of said second current control means, said load means being de-energized when said switching means is in its first stable state and energized when in its second stable state; a source of input signals connected to said input terminals of said first current control means to switch said switching means from said first stable state to said second stable state; biasing means connected to said input terminals of said first current control means to provide a first substantially constant bias and a periodic reverse bias pulse, said substantially constant bias being of such polarity as to tend to switch said switching means to said second stable state, said substantially constant bias being of insufficient magnitude to switch said switching means in the absence of said input signal but of sufficient magnitude to hold said switching means in said second stable state until the appearance of said periodic reverse bias, said periodic reverse bias being of very short duration but of sufficient magnitude to override said constant bias and of such polarity to switch said switching means to said first stable state.

5. Switching apparatus comprising: switching means comprising first and second semiconductor means each having input and output terminals and being operable between a first and a second stable state, circuit means connecting said output terminals of said first semiconductor means to said input terminals of said second semiconductor means; load means connected to said output terminals of said second semiconductor means, said load means being de-energized when said switching means is in its first stable state and energized when in its second stable state; a source of input signals connected to said input terminals of said first semiconductor means to switch said switching means from said first stable state to said second stable state; dual function bias generating means energized independent of said signal source and connected to said input terminals of said first semiconductor means to provide a first substantially constant bias current and a periodic reverse polarity bias current reset pulse, said substantially constant bias being of such polarity as to tend to switch said switching means to said second stable state, said substantially constant bias being of insufficient magnitude to switch said switching means in the absence of said input signal but of sufficient magnitude to hold said switching means in said second stable state until the appearance of said periodic reverse bias, said periodic reverse bias being of very short duration but of sufficient magnitude to override said constant bias and of such polarity to switch said switching means to said first stable state.

6. Switching apparatus comprising: bistable switching means comprising electronic current control means having input and output terminals, load means connected to said output terminals of said current control means, said load means being de-energized when said switching means is in its first stable state and energized when in said second stable state; a source of input signals connected to the input terminals of said current control means to activate said switching means from said first stable state to said second stable state; first biasing means connected to the input terminals of said current control means to periodically switch said switching means from said second stable state to said first stable state; variable second biasing means comprising impedance means and capacitance means, circuit means connecting said impedance means from the output terminals to the input terminals of said current control means, further circuit means connecting said capacitance means across a portion of said impedance means, the charge on said capacitance means controlling the level of said input signal magnitude required to activate said switching means, said level of input signal magnitude being variable by varying the charge on said capacitance means in response to the output of said second current control means, said variance in said input signal level constituting an input signal differential determined by said second biasing means and being substantially independent of said current control means.

7. Switching apparatus comprising: bistable switching means comprising first and second semiconductor means having input and output terminals, circuit means connecting the output terminals of said first semiconductor means to the input terminals of said second semiconductor means; load means connected to said output terminals of said second semiconductor means, said load means being de-energized when said switching means is in its first stable state and energized when in said second stable state; a source of input signals connected to the input terminals of said first semiconductor means to switch said switching means from said first stable state to said second stable state; first biasing means connected to the input terminals of said first semiconductor means to periodically switch said switching means from said second stable state to said first stable state; variable second biasing means comprising impedance means and capacitance means, circuit means connecting said impedance means from the output terminals of said second semiconductor means to the input terminals of said first semiconductor means, further circuit means connecting said capacitance means across a portion of said impedance means, the charge on said capacitance means controlling the level of said input signal magnitude required to activate said switching means, said level of input signal magnitude being variable by varying the charge on said capacitance means in response to the output of said second semiconductor means, said variance in said input signal level constituting an input signal differential determined by said second biasing means and being substantially independent of said first and second semiconductor means.

8. Switching apparatus comprising: switching means having input and output circuits and being operable between a first and a second stable state; load means connected to the output circuit of said switching means, said load means being de-energized when said switching means is in its first stable state and energized when in its second stable state; a source of input signals connected to the input circuit of said switching means to activate said switching means from said first stable state to said second stable state; first biasing means connected to the input circuit of said switching means to provide a periodic reset pulse to reset said switching means from said second stable state to said first stable state, said reset occurring even with the presence of an input signal; controllable second biasing means operable to provide a first or a second level of bias, said second biasing means being connected from the output circuit to input circuit of said switching means and being operable from said first to said second level in response to the state of said switching means, so as to require an input signal of first predetermined magnitude to initially activate said switching means and an input signal of second predetermined magnitude to subsequently activate said switching means after reset.

9. Phase discriminator switching apparatus comprising: bistable switching means comprising first and second semiconductor means each having input and output terminals, circuit means connecting the output terminals of the first semiconductor means to the input terminals of the second semiconductor means; load means connected to the output terminals of the second semiconductor means; reference signal means; third semiconductor means having input and output terminals; circuit means connecting the output terminals of said third semiconductor means and said reference signal means to the input terminals of said first semiconductor means; the output of said third semiconductor means providing the activating signal for said bistable switching means; a source of alternating signals connected to the input terminals of said third semiconductor means; biasing means connected to the input terminals of said first semiconductor means to provide a substantially constant bias and a periodic bias, said substantially constant bias being of such polarity as to tend to switch said switching means to said second stable state, said substantially constant bias being of insufficient magnitude to switch said switching means in the absence of said activating signal but of sufficient magnitude to hold said switching means in said second stable state until the appearance of said periodic bias, said periodic bias being of very short duration but of sufficient magnitude to override said constant bias and of such polarity to switch said switching means to said first stable state, said periodic bias being synchronized with said third semiconductor means and said reference signal means to appear during the presence of said activating signal for said switching means.

10. Phase discriminator switching apparatus comprising: bistable switching means having input and output terminals and being operable between a first and a second stable state, load means connected to the output terminals of said bistable switching means, said load means being deenergized when said switching means is in its first stable state and energized when in its second stable state; reference signal means; third semiconductor means having input and output terminals, circuit means connecting said reference signal means to the output terminals of said third semiconductor means, said third semiconductor means and said reference signal means forming a phase discriminator means having input and output terminals, circuit means connecting the output terminals of said discriminator means to the input terminals of said bistable switching means, the output of said discriminator means providing the activating signal for said bistable switching means; a source of input signals connected to the input terminals of said discriminator means; biasing means connected to the output terminals of said bistable switching means to provide a substantially constant bias and a periodic bias, said substantially constant bias being of such polarity as to tend to switch said switching means to said second stable state, said substantially constant bias being of insufficient magnitude to switch said switching means in the absence of said activating signal but of sufficient magnitude to hold said switching means in said second stable state until the appearance of said periodic bias, said periodic bias being of very short duration but of sufficient magnitude to override said constant bias and of such polarity to switch said switching means to said first stable state, said periodic bias being synchronized with said discriminator means to appear during the presence of said activating signal for said switching means.

References Cited in the file of this patent

UNITED STATES PATENTS

| | | |
|---|---|---|
| 2,802,155 | Marsden | Aug. 6, 1957 |
| 2,849,622 | Gridley | Aug. 26, 1958 |